United States Patent [19]

Kozuka

[11] Patent Number: 5,324,360
[45] Date of Patent: Jun. 28, 1994

[54] METHOD FOR PRODUCING NON-MONOCRYSTALLINE SEMICONDUCTOR DEVICE AND APPARATUS THEREFOR

[75] Inventor: Kiraku Kozuka, Hiratsuka, Japan

[73] Assignee: Canon Kabushiki Kaisha, Tokyo, Japan

[21] Appl. No.: 886,048

[22] Filed: May 20, 1992

[30] Foreign Application Priority Data

May 21, 1991 [JP] Japan ................. 3-144173
Dec. 10, 1991 [JP] Japan ................. 3-325800

[51] Int. Cl.⁵ ............................. C23C 16/50
[52] U.S. Cl. .................. 118/719; 118/723 E; 118/723 I; 118/728

[58] Field of Search ............... 118/723, 719, 728, 729, 118/723 MW, 723 ME, 723 MR, 723 MA, 723 AN, 723 E, 723 ER, 723 I, 723 IR; 156/345

[56] References Cited

U.S. PATENT DOCUMENTS

4,664,951  5/1987  Doehler ................. 118/718 X
5,180,434  1/1993  DiDio et al. ............ 118/718

Primary Examiner—Brian E. Hearn
Assistant Examiner—Jonathan D. Baskin
Attorney, Agent, or Firm—Fitzpatrick, Cella, Harper & Scinto

[57] ABSTRACT

An apparatus for producing a non-monocrystalline semiconductor device having two film forming chambers. The apparatus has means for transferring a substrate from one film forming chamber to the other film forming chamber while maintaining the first film forming chamber in a plasma atmosphere.

3 Claims, 5 Drawing Sheets

METHOD FOR PRODUCING NON-MONOCRYSTALLINE SEMICONDUCTOR DEVICE AND APPARATUS THEREFOR

BACKGROUND OF THE INVENTION

1. Field of the Invention

The present invention relates to a method for producing a non-monocrystalline semiconductor device adapted for use in a photoelectric converting device such as a solar cell, a line sensor or an area sensor, a thin film transistor (TFT) for the liquid crystal display or the like, more particularly a non-monocrystalline semiconductor device formed by successive laminations of plural thin semiconductor films, and an apparatus for executing the method.

2. Related Background Art

Non-monocrystalline thin semiconductor films, particularly those of non-monocrystalline silicon and compounds thereof, are frequently used in photoelectric converting devices of a large area such as solar cell or line sensor, and in this film transistors of the liquid crystal displays, since such thin films can be prepared at a low temperature and show strong light absorption in the visible region.

These devices, as exemplified by solar cells, generally have a laminated structure of two or more thin semiconductor films, such as the PIN structure, in order to attain their functions. For producing such devices, there is generally employed an apparatus of load-look system in which films can be continuously formed without breaking vacuum state after the substrate is loaded. Such load-lock apparatus is capable of forming different layers in independent vacuum chambers, and is effective in improving the device performance in terms of impurity reduction in each layer.

For producing the non-monocrystalline thin semiconductor film, there have been various methods such as plasma CVD, photo CVD, thermal CVD, sputtering and vacuum evaporation, but plasma CVD has principally been employed since it can provide a relatively high film quality and can easily provide a film of a large area. Plasma CVD consists of film deposition on a substrate, by decomposing raw material gas with a high frequency field or microwave thereby generating a deposition precursor. Among the plasma CVD methods, most popularly utilized is the capacitance-coupled high frequency plasma CVD employing a high frequency power of 13.56 MHz as the excitation source.

Figure 5:
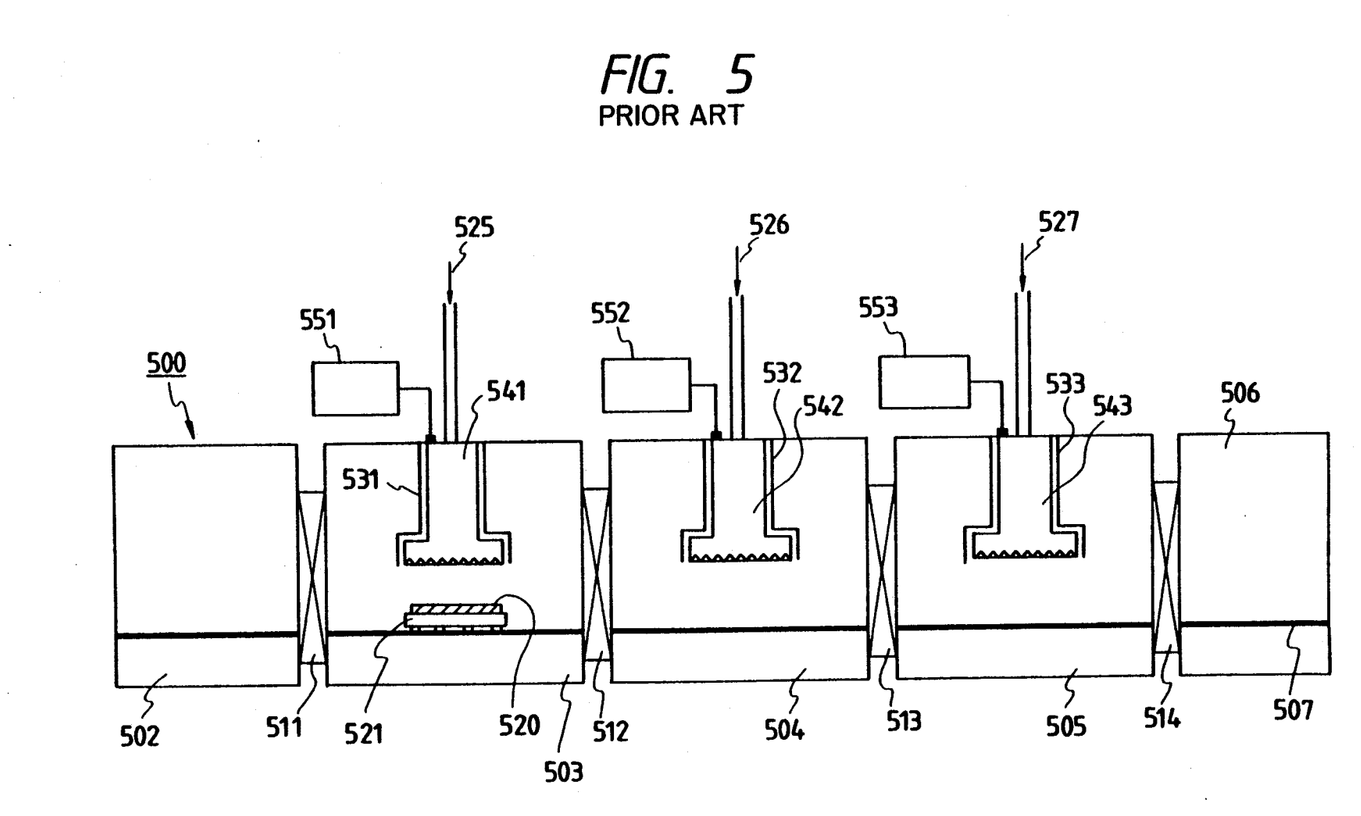
FIG. 5 is a schematic view of an example of the conventional plasma CVD apparatus.

FIG. 5 is a schematic view of a conventional capacitance-coupled high frequency plasma CVD apparatus of load-lock system employed for producing a PIN device.

The apparatus 500 is provided with a loading chamber 502; an N-layer forming chamber 503 connected to said loading chamber 502 through a first gate valve 511; an I-layer forming chamber 504 connected to said N-layer forming chamber 503 through a second gate valve 512; a P-layer forming chamber 505 connected to said I-layer forming chamber 503 through a third gate valve 513; and an unloading chamber 506 connected to said P-layer forming chamber 505 through a fourth gate valve 514. Thus, said apparatus 500 is a multi-chamber system with five chambers in total, in which the N-layer forming chamber 503, the I-layer forming chamber 504 and the P-layer forming chamber 505, being mutually connected through the gate valves 512, 513, are made independent in terms of vacuum level.

Said capacitance-coupled high frequency plasma CVD apparatus 500 is utilized in the following manner, in the preparation of a device with PIN structure.

At first a substrate 520 is set on a substrate holder 521, which is placed on rails 507 and loaded in the loading chamber 502. Then the interior of the loading chamber 502 is evacuated to a predetermined pressure, and the substrate 520 is heated to a predetermined temperature. Subsequently the substrate holder 521 is transferred into the N-layer forming chamber 503 by opening the first gate valve 511, which is thereafter closed.

Then the substrate 520 is heated to a predetermined temperature by a first heater (not shown) provided in the N-layer forming chamber 503. First raw material gas 525 is introduced into the N-layer forming chamber 503, and a first high frequency source 551 is turned on to apply a high frequency power to a first high frequency electrode 541, thereby generating plasma in the N-layer forming chamber 503 and effecting the formation of an N-layer. After the completion of film formation, said first high frequency source 551 is turned off, and the introduction of first raw material gas 525 into the N-layer forming chamber 503 is terminated.

Subsequently the interior of the N-layer forming chamber 503 is evacuated, and the substrate holder 521 is transferred to the I-layer forming chamber 504 by opening the second gate valve 512. Then an I-layer is formed with second raw material gas 526, in a procedure similar to that for N-layer formation. Then the interior of the I-layer forming chamber 504 is evacuated, and the substrate holder 521 is transferred to the P-layer forming chamber 505 by opening the third gate valve 513. A P-layer is formed with third raw material gas 527, in a procedure similar to that for N-layer formation. Then the interior of the P-layer forming chamber 505 is evacuated, and the substrate holder 521 is transferred to the unloading chamber 506 by opening the fourth gate valve 514. Finally air is introduced into the unloading chamber 506, and the substrate holder 521 is taken out from said unloading chamber 506.

The N-, I- and P-layers can be formed in succession on the substrate 520 in the above-explained manner. Other devices can also be formed in a similar manner by suitably varying the species of raw material gasses and the number of film forming chambers.

In the capacitance-coupled high frequency plasma CVD apparatus 500, electrically grounded first to third shields 531-533 are respectively provided around the first to third high frequency electrodes 541-543, for avoiding dispersion of discharge.

However, in the film formation utilizing the above-explained plasma CVD apparatus 500, the plasma has to be interrupted between successive film formations. The present inventors have found that this fact creates a plasma on/off hysteresis at the interface of the semiconductor layer, eventually affecting the device characteristics.

More specifically, such plasma CVD apparatus causes plasma damage on the interface by the initial plasma. The initial plasma means the plasma generated from the moment of activation of the excitation source to the stationary state, and induces a damage in the underlying film, thus generating defects in the interface. Also the newly deposited film shows deteriorated interface characteristics, as the initially deposited part of said film, constituting the interface region, is formed by such initial plasma state. There are also reports that impurities such as oxygen, carbon and nitrogen tend to deposit mainly at the interface, and such phenomenon results from the producing method explained above.

The device characteristics are significantly affected by such interface. For example, the amorphous silicon thin film transistor can be prepared by consecutive depositions in the order of an insulating film and an amorphous silicon film, or in the order of an amorphous silicon film and an insulating film, but the electrical properties and reliability of the device are considered generally superior in the former process. This is because the device characteristics are governed by the characteristics of the interface between the amorphous silicon and the insulating film, as the channel for the carriers is formed in a part of said amorphous silicon, close to said interface. More specifically, in the latter process, the device characteristics are deteriorated by the plasma damage induced in the surface of the amorphous silicon, constituting the channel of the thin film transistor, at the formation of insulating film on the amorphous silicon. However, even in the former process, the inherent film characteristics are not fully exploited because the channel is formed in the amorphous silicon deposited by the initial plasma.

Also in the photoelectric converting devices, the gain and the photoresponse are affected by the interface characteristics.

SUMMARY OF THE INVENTION

An object of the present invention is to provide a method for producing a non-monocrystalline semiconductor device with excellent interface characteristics, without inducing plasma damage to the interfaces of the laminated thin non-monocrystalline films, and an apparatus for executing said method.

Another object of the present invention is to provide a method for producing a semiconductor device of high performance, without undesirable influences of plasma damage or concentrated impurity deposition in the interfaces of semiconductor layers, and an apparatus for executing said method.

DETAILED DESCRIPTION OF THE PREFERRED EMBODIMENTS

In a preferred embodiment, the method of the present invention, for producing a non-monocrystalline semiconductor device by forming at least two non-monocrystalline thin semiconductor films in succession by plasma CVD on a substrate, is featured by a fact that the growing surface of the thin semiconductor film on the substrate and the interfaces of said thin films are constantly maintained in a plasma atmosphere until the successive films formations are completed.

Also in another embodiment of the present invention, an apparatus is provided for producing a non-monocrystalline semiconductor device, including at least two independent film forming chambers in vacuum conditions and adapted for forming a non-monocrystalline semiconductor film on a substrate, comprising means for transferring said substrate, subjected to the formation of said non-monocrystalline semiconductor film in one of said film forming chambers, to the other film forming chamber while maintaining said substrate in a plasma atmosphere.

According to the present invention, in case of formation of two or more semiconductor films in consecutive manner, the substrate is always placed in a plasma atmosphere. Consequently, the growing surface of film and the interfaces of films are constantly irradiated with plasma, so that the damage by initial plasma, resulting from the on/off action thereof, can be avoided.

The apparatus of the present invention is provided with a configuration capable of generating plasma not only in the film forming areas but also in all the paths of transportation of the substrate.

In the present invention, the excitation source and the exciting method of plasma can be selected depending on the apparatus, but are preferably the same as those used for film forming. The exciting power for plasma except for film forming need not be constant, but may be varied, for example, continuously varying the exciting power for plasma during the transfer of the substrate to the next film formation process, thereby avoiding discontinuity in the plasma power.

In the present invention, since the plasma is continuously generated, the start and end of film formation can be achieved by the switching of the raw material gas. At the film formation, therefore, the raw material gas is preferably used not singly but as a mixture with diluting gas. With the use of such mixed gas, when the supply of the raw material gas is terminated after the completion of film formation, the discharge is maintained by the diluting gas so that the fluctuation in plasma can be suppressed. The diluting gas can be hydrogen, argon or helium, but there is preferred gas principally composed of hydrogen.

For achieving stable and responsive supply of the raw material gas, the gas supply system may be divided into a path passing through the film forming area and another path directly going to the discharge side without passing through the film forming area, and the start and end of film formation may be controlled by the switching of said gas supply paths. In this case, the raw material gas is made to flow with a predetermined flow rate before the start of film formation, and the path of the raw material gas alone is switched at the start of film formation. This method is particularly effective in case the flow control device has a relatively slow response.

Thus, the present invention can prevent the drawbacks in the conventional method, namely deterioration in the characteristics of the semiconductor device resulting from plasma damage in the semiconductor interfaces and localized precipitation of impurities in the lamination of semiconductor films, thereby providing an improved semiconductor device of high performance.

In the following the present invention will be clarified in detail by embodiments thereof shown in the attached drawings.

EMBODIMENT 1

Figure 1:
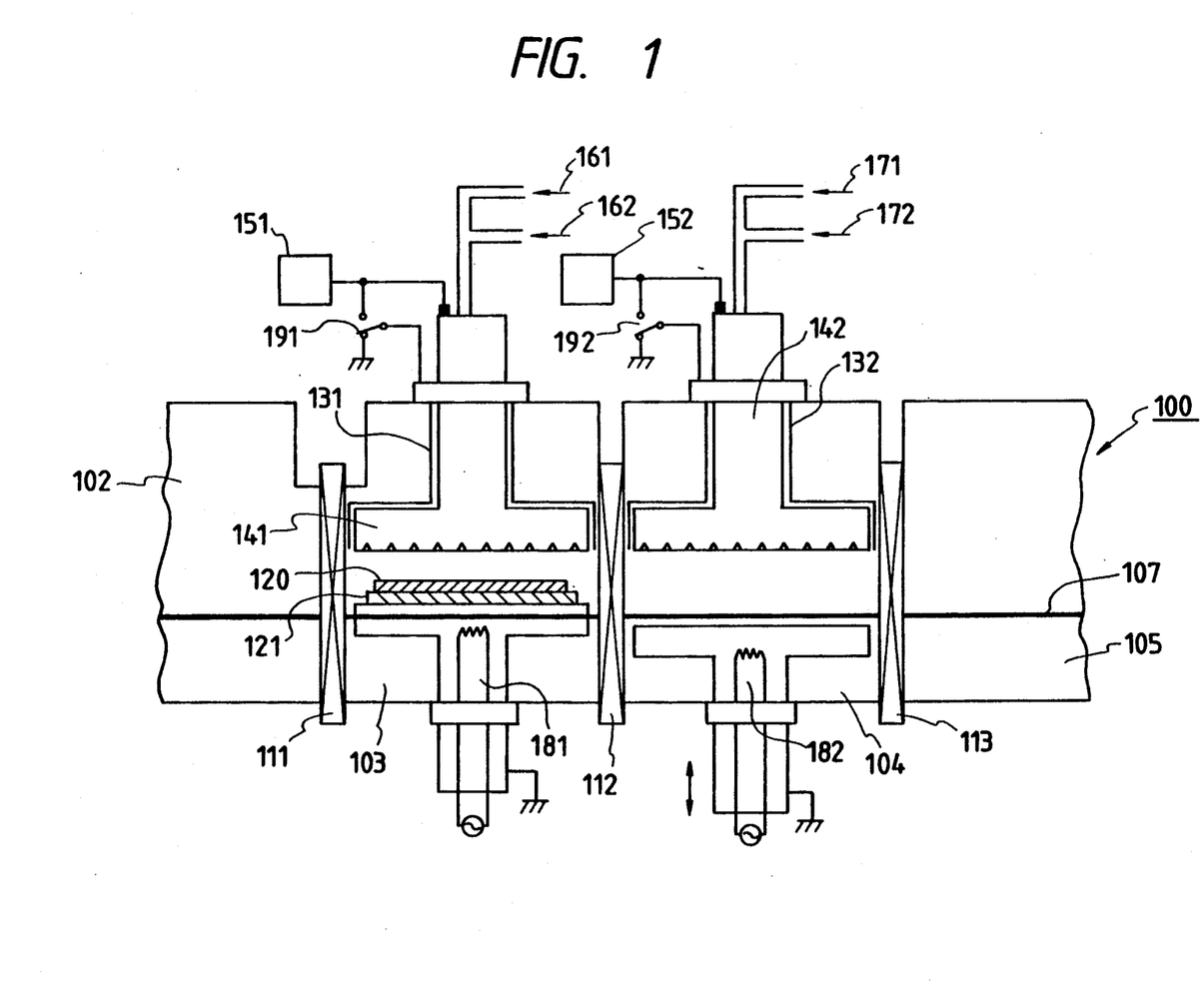
FIG. 1 is a schematic view of an example of the semiconductor device producing apparatus of the present invention.

FIG. 1 is a schematic view of a part of a capacitance-coupled high frequency plasma CVD apparatus of load-lock type, constituting an embodiment of the apparatus of the present invention for producing a non-monocrystalline semiconductor device.

Said plasma CVD apparatus shown in FIG. 1 is different from the conventional capacitance-coupled high frequency plasma CVD apparatus shown in FIG. 5, in the following points:

(1) A first high frequency electrode 141 in an N-layer forming chamber 103, a second high frequency electrode 142 in an I-layer forming chamber 104, and a third high frequency electrode (not shown) in a P-layer forming chamber 105 have a length approximately equal to the length of a glass substrate 120, in the transporting direction thereof, in said chambers 103, 104, 105. In the present invention, the length of the glass substrate, in the transporting direction thereof, is preferably 70% or more, more preferably 80% or more, of the length of the high frequency electrodes:

(2) First to third shields 131-133 (133 being not shown) provided respectively around the first to third high frequency electrodes 141-143 (143 being not shown) are provided with first to third switches 191-193 (193 being not shown) for connecting said shields to ground or to the high frequency potential.

In the following there will be explained, as an example, the process of forming a non-monocrystalline silicon PIN diode, with the above-explained plasma CVD apparatus 100.

A glass substrate 120, bearing evaporated chromium, was set on a substrate holder 121, which was placed on rails 107 and loaded into a loading chamber 102. Subsequently the interior of the loading chamber 102 was evacuated, and the glass substrate 120 was heated to a predetermined temperature. Then the substrate holder 121 was transferred to the N-layer forming chamber 103 by opening a first gate valve 111, which was subsequently closed. A first heater 18 1, serving also as an auxiliary electrode, was moved upwards to lift the substrate holder 121, and the glass substrate 120 placed thereon was heated to a predetermined temperature by said first heater 181.

Then first raw material gas 161, consisting of silane gas containing 1% of phosphine, and hydrogen gas 162 were introduced, with respective flow rates of 10 sccm and 40 sccm, into the N-layer forming chamber 103. The pressure therein was regulated to 0.5 Torr, and the first high frequency source 151 was turned on to initiate the formation of the N-layer. In this operation, the first shield 131 was electrically grounded by the first switch 191, in order that the plasma is concentrated between the glass substrate 120 and the first high frequency electrode 141. When the N-layer reached a predetermined thickness, the introduction of silane gas 161 into the N-layer chamber 103 was terminated, and hydrogen gas 172 was introduced with a flow rate of 40 sccm into the I-layer forming chamber 104 whereby the pressure therein was made same as that of the N-layer forming chamber 103. Then a second high frequency source 152 was turned on to generate hydrogen plasma between the second high frequency electrode 142 and a second heater 182 which serves also as an auxiliary electrode. While the second high frequency source was turned on, the second shield 132 was electrically grounded by the second switch 192. A second gate valve 112 was then closed, but the surface of the glass substrate 120 after N-layer formation was exposed to the hydrogen plasma because the hydrogen plasma was generated in the N-layer forming chamber 103 and in the I-layer forming chamber 104. Subsequently the second gate valve 112 was opened, and the first and second shields 131, 132 were connected to the high frequency potential by the switches 191, 192, whereby the hydrogen plasma electrode 141 and the first heater 181, and that confined in a space between the second high frequency electrode 142 and the second heater 192 spread into the second gate valve 112.

Then, after the substrate holder 121 was transferred to the i-layer forming chamber 104, the second shield 132 was grounded by the second switch 192. Thereafter the second heater 192 was moved upwards, the first high frequency Source 152 was turned off, and the second gate valve 112 was closed. In this state the glass substrate 120 was exposed to the hydrogen plasma in the I-layer forming chamber 104. Subsequently third valve gate 113 was opened and silane gas 171 was introduced into the I-layer forming chamber 104 to initiate the I-layer formation.

After the I-layer formation, a P-layer was formed in a similar manner, and the glass substrate 120 was taken out from an unloading chamber (not shown). Thereafter an indium tin oxide (ITO) film was formed on the glass substrate 120 by evaporation and patterned.

As explained above, the capacitance coupled high frequency plasma CVD apparatus 100 shown in FIG. 1 can constantly maintain the film growing surface of the glass substrate 120, the interface between the N- and I-layers and that between the I- and P-layers in a hydrogen plasma atmosphere, from the start of N-film formation to the end of P-layer formation.

For the purpose of comparison, a non-monocrystalline silicon PIN diode was prepared under similar conditions with the conventional capacitance-coupled high frequency plasma CVD apparatus 500 shown in FIG. 5, and the characteristics of both diodes were evaluated. As a result, the PIN diode prepared with the plasma CVD apparatus 100 of the present invention showed superior performances in the inverse dark current and in the photoresponse, thus confirming the advantage of the present invention.

EMBODIMENT 2

Figure 2:
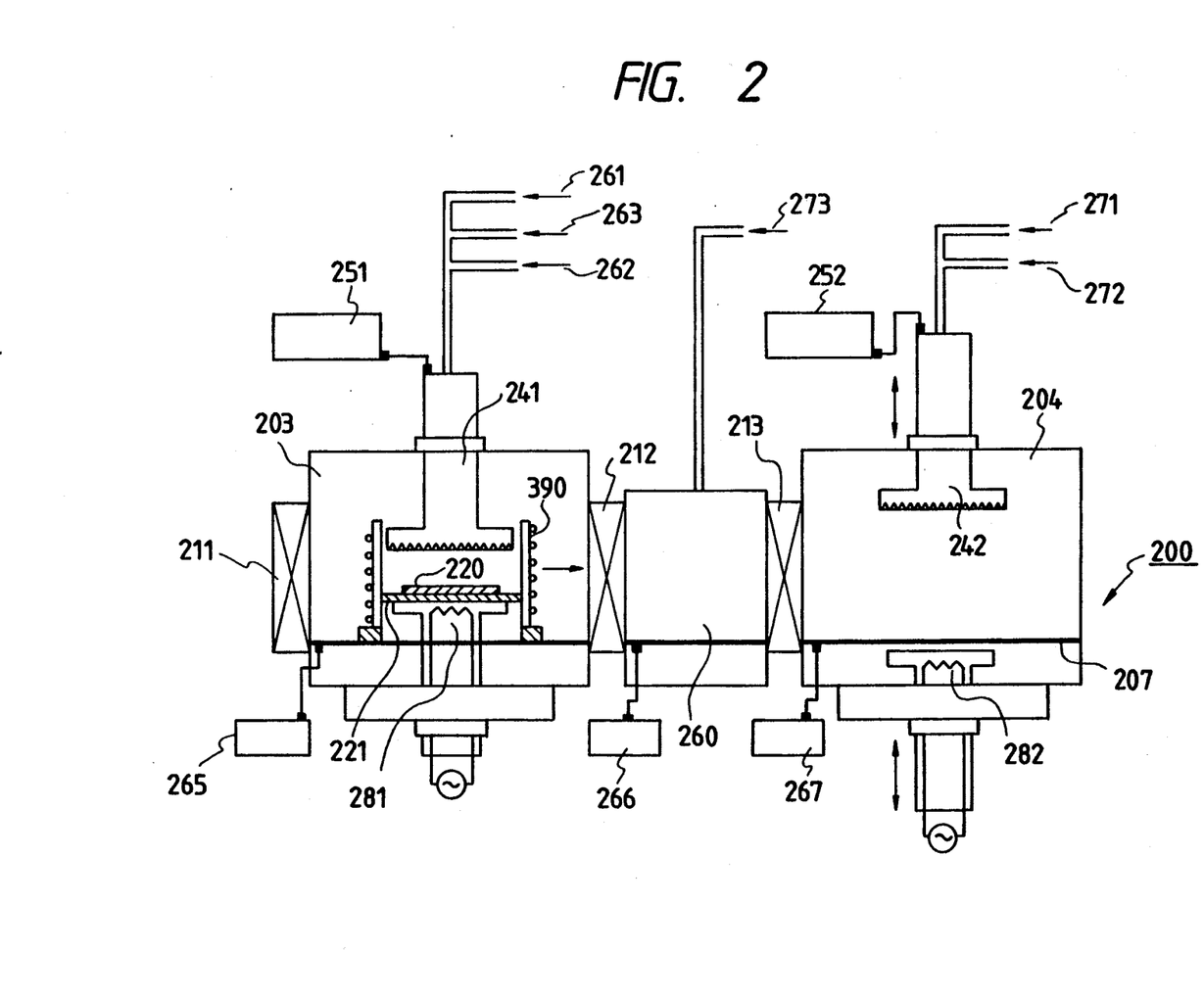
FIG. 2 is a schematic view of another example of the semiconductor device producing apparatus of the present invention.

FIG. 2 is a schematic view of a part of a capacitance-coupled high frequency plasma CVD apparatus, constituting another embodiment of the apparatus of the present invention for producing a non-monocrystalline semiconductor device.

Figure 3A:
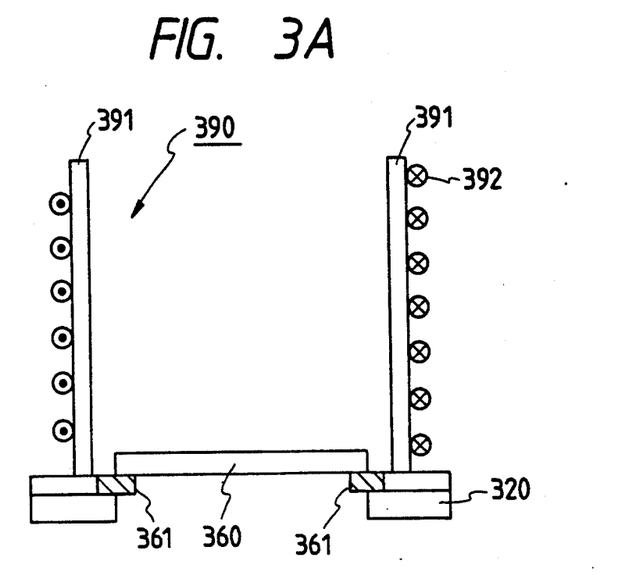
FIGS. 3A and 3B are schematic views of an example of the component part adapted for use in the apparatus of the present invention.
Figure 3B:
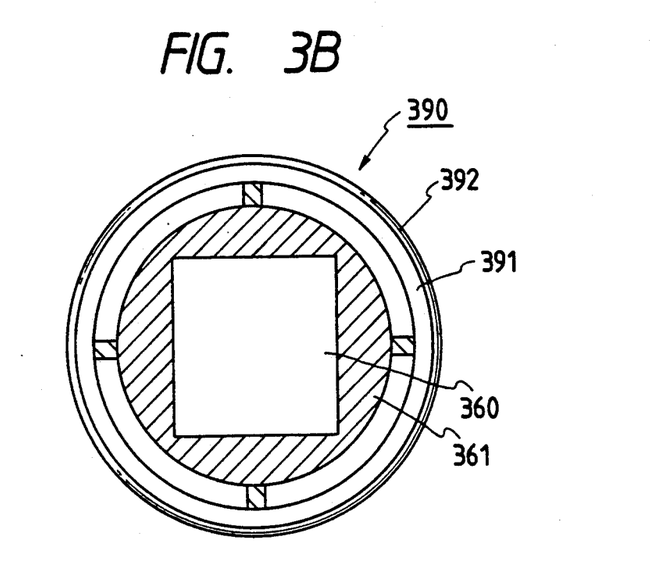

Said plasma CVD apparatus 200, designed for producing an amorphous silicon thin film transistor (TFT), is provided with a loading chamber (not shown), a silicon nitride film forming chamber 203, an I-amorphous silicon film forming chamber 204, an amorphous N-silicon film forming chamber (not shown), and an unloading chamber (not shown), and is different from the conventional apparatus shown in FIG. 5, for producing a non-monocrystalline semiconductor device, in the following points:

(1) A substrate 220 is transported, together with a substrate holder 221, in an induction-coupled plasma container 390. As shown in FIGS. 3A and 3B, said container 390 is composed of a cylindrical glass container 391, around which a coil 392 is wound, and the substrate holder 361 for substrate 360 is set on an annular bottom 320 of said container 391. In such induction-coupled plasma container 390, plasma is generated inside the glass container 391, by the supply of high frequency electric power to said coil 392;

(2) Between the silicon nitride film forming chamber 203 and the amorphous I-silicon film forming chamber 204, there is provided a first transfer tunnel 260 with a second gate valve 212 and a third gate valve 213. Although not illustrated, a second transfer tunnel with 4th and 5th gate valves is provided between the amorphous I-silicon film forming chamber 204 and the amorphous N-silicon film forming chamber:

(3) The 1st to 3rd electrodes 241, 242, 243 (243 being not shown) are rendered vertically movable:

(4) The rails 207 are electrically interrupted between the silicon nitride film forming chamber 203 and the first transfer tunnel 260, between the first transfer tunnel 260 and the amorphous I-silicon film forming chamber 204, between the amorphous I-silicon film forming chamber 204 and the second transfer tunnel (not shown), and between the second transfer tunnel and the amorphous N-silicon film forming chamber (not shown). Said rails 207 are connected to a first high frequency source 265 for coil in the silicon nitride film forming chamber 203, to a second high frequency source 266 for coil in the first transfer tunnel 260, to a third high frequency source 267 for coil in the amorphous I-silicon film forming chamber 204, to a fourth high frequency source (not shown) for coil in the second transfer tunnel (not shown), and to a fifth high frequency source (not shown) for coil in the amorphous N-silicon film forming chamber. (not shown).

In the following there will be explained an example of preparation of an amorphous silicon TFT with the above-explained capacitance-coupled high frequency plasma CVD apparatus 200.

A glass substrate 220, on which chromium was deposited by evaporation and photolithographically patterned to form a gate electrode, was set on a substrate holder 221, and said holder 221 was set in the plasma container 390. After said plasma container 390 was loaded in the unrepresented loading chamber, the interior thereof was evacuated and the glass substrate was heated to a predetermined temperature. Then the first gate valve 211 was opened and the plasma container 390 was transferred to the silicon nitride film forming chamber 203.

After the first gate valve 211 was closed, the first heater 281 was moved upwards through the aperture in the bottom 320 of the glass container 391, thereby moving the glass substrate 220 to a predetermined position, and said substrate 220 was heated to a predetermined temperature by the first heater 281. Then, the first high frequency electrode 241 was moved downwards to a predetermined position, and silane gas 261 and ammonia gas 263 as the raw material gasses and hydrogen gas 262 as the diluting gas were introduced into the silicon nitride film forming chamber 203. Subsequently the first high frequency source 251 was turned on to apply high frequency power to the first high frequency electrode 241, thereby forming a silicon nitride film on the glass substrate 220. Introduction of silane gas 261 and ammonia gas 263 into the silicon nitride film forming chamber 203 was terminated when the silicon nitride film reached a predetermined thickness. In this state hydrogen gas 262 alone was introduced into said chamber 203, in which hydrogen plasma was generated by the high frequency power applied to the first high frequency electrode 241.

Then high frequency power was supplied to the coil 392 around the glass container 391, from the first high frequency source 265 for coil through the rails 207, and the first high frequency source 251 was turned off to terminate the high frequency power supply to the first high frequency electrode 241. In this state, hydrogen plasma was generated in the glass container 391 by induction coupling. Thereafter the first high frequency electrode 241 and the first heater 281 were returned to predetermined positions, and hydrogen gas 273 was introduced into the first transfer tunnel 260 to a pressure the same as that in the silicon nitride film forming chamber 203. The plasma container 390 was transferred into the first transfer tunnel 260 by opening the second gate valve 212, which was subsequently closed. In this state, high frequency power was supplied to the coil 392 through the rails 207, from the second high frequency source 266 for coil, whereby hydrogen plasma could be maintained in the glass container 291 while it was positioned in the first transfer tunnel 260.

Then, hydrogen gas 272 was introduced into the amorphous I-silicon film forming chamber 204, and the pressure in the first transfer tunnel 260 was regulated same as that in said chamber 204. The plasma container 390 was transferred to said chamber 204 by opening the third gate valve 213. After said gate valve 213 was closed, the second heater 282 was moved upwards through the aperture in the bottom 320 of the glass container 391 to move the glass substrate 220 to a predetermined position, and said substrate was heated to a predetermined temperature by the second heater 282. In this State, high frequency power was supplied from the third high frequency source 267 for coil to the coil 392 through the rails 207, whereby hydrogen plasma was generated in the glass container 391.

Then the second high frequency electrode 242 was lowered to a predetermined position, the second high frequency source 252 was turned on, and the third high frequency source for coil was turned off. In this state, hydrogen plasma was generated in the glass container 391 by the high frequency power applied to the second high frequency electrode 252. Subsequently, silane gas 27 1, as the raw material gas, was introduced into the amorphous I-silicon film forming chamber 204, in addition to the hydrogen gas 272, thereby forming an amorphous I-silicon film on the glass substrate 220. When said film reached a predetermined thickness, the supply of silane gas 271 alone into the amorphous I-silicon film forming chamber 204 was terminated.

Then an amorphous N-silicon film was formed on the glass substrate 220 in a similar manner, and the glass substrate 220 was taken out from the unloading chamber. Then aluminum was deposited by evaporation and patterned on said substrate 220, whereby an amorphous silicon TFT was completed.

In the capacitance-coupled high frequency plasma CVD apparatus 200 explained above, the glass substrate 220 was constantly maintained in a plasma atmosphere, since the film formation onto said glass substrate was conducted in capacitance-coupled plasma while the transfer of said substrate is conducted in induction-coupled plasma. For this reason there was obtained an excellent semiconductor device, without deterioration in the characteristics at the interfaces of the deposited films.

EMBODIMENT 3

Figure 4:
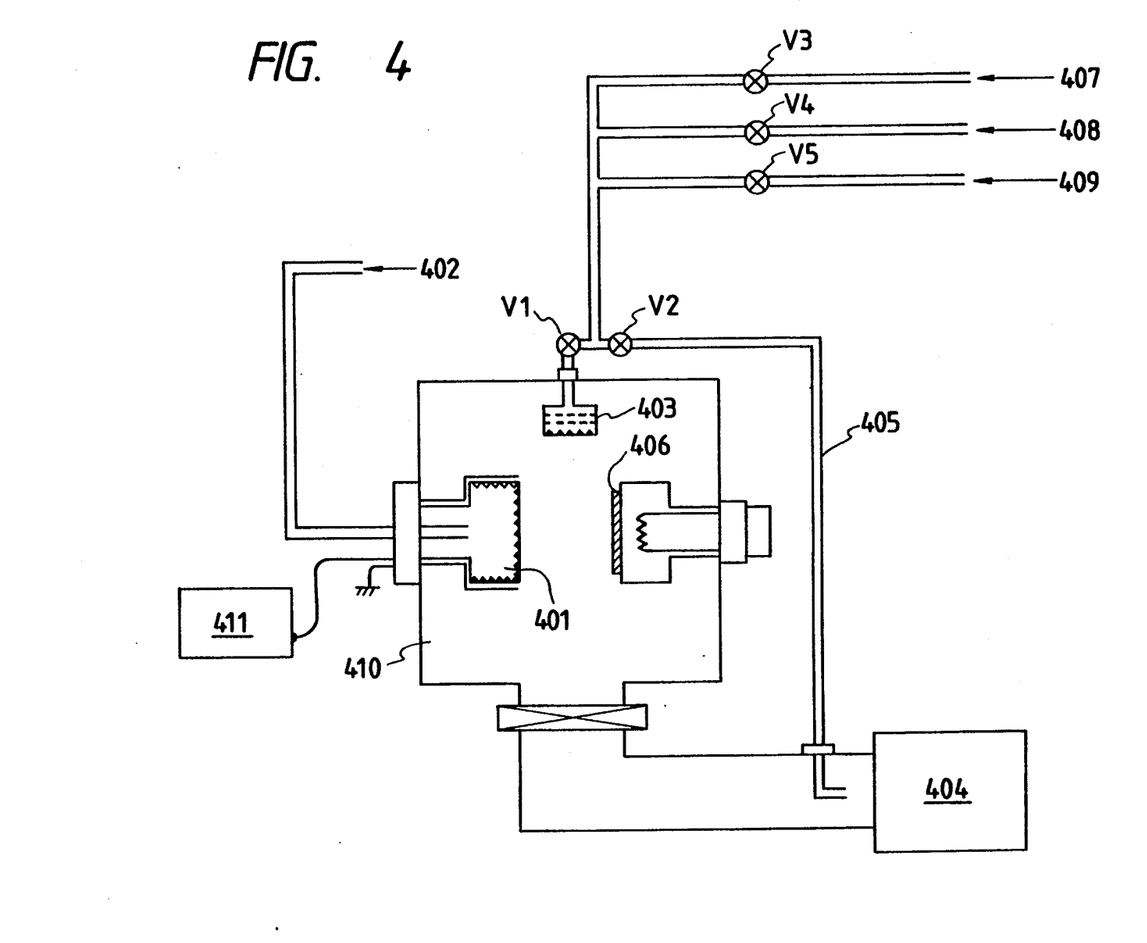
FIG. 4 is a schematic view of another example of the semiconductor device producing apparatus of the present invention.

In the following there will be explained another embodiment of the present invention illustrated in FIG. 4, in which film formations are conducted in a single chamber, and an amorphous silicon TFT is produced by gas switchings. In the illustrated apparatus, hydrogen gas 402, containing 5% helium gas, is supplied from a flat electrode 401, and raw material gasses are supplied in a space between the electrodes. A buffer 403 is provided for improving the distribution of the raw material gasses, but the presence of said buffer retards the response of start and end of supply of said raw material gasses. Consequently a by-pass line 405 is provided for directly discharging the raw material gasses by a vacuum pump 404, and the gas supply to the chamber 410 and the termination thereof are executed by simultaneous switching of valves V1, V2 in such a manner that the valve V2 is automatically closed or opened respectively when the valve V1 is opened or closed.

At first a substrate 406, already bearing patterned chromium as gate metal, was loaded in the chamber, and there were executed evacuation of chamber and heating of substrate. Then valves V3, V4 and V1 were opened to introduce ammonia gas 407 and silane gas 408 as the raw material gasses for silicon nitride, and hydrogen gas 402, were introduced into the chamber 410. Then a high frequency source 411 was turned on to form a silicon nitride film, and, when a desired film thickness was reached, the valves V1, V2 were switched and the valves V3, V4 were closed to terminate the supply of the raw material gasses. In this state the hydrogen gas 402 alone was supplied into the chamber 410 and the high frequency power 411 was still continued, so that the hydrogen plasma was generated between the electrodes. Since the hydrogen flow rate and the high frequency power in the next amorphous silicon film formation were different from that in the silicon nitride film formation, the hydrogen flow rate was gradually varied with the adjustment of matching so as to reduce the reflected power of the high frequency power, and the high frequency power was then regulated to reach the film forming conditions for the amorphous silicon. Subsequently the valve V4 was opened to introduce silane gas 408 into the bypass line 405, and, when the flow rate was stabilized, the valves V1, V2 were switched to introduce silane gas into the chamber, thereby forming an amorphous silicon layer.

Such feeding method of raw material gasses enables the gas supply with a relatively stable flow rate from the initial stage of film formation, even if the high frequency plasma is continuously generated. When the amorphous silicon layer reached a desired thickness, the valves V1, V2 were switched to terminate the supply of silane gas 408 into the chamber 410. The silane gas was supplied to the bypass line 405, and the valve V5 was opened to also supply phosphine gas 409 diluted with hydrogen, as the doping gas, and flow rates were respectively regulated. When the flow rates were stabilized, the valves V1, V2 were again switched to introduce silane gas 408 and phosphine gas 409 into the chamber 410, thereby forming a doped layer. When the doped layer reached a desired thickness, the supply of high frequency power and all gasses was terminated, and the substrate was taken out after cooling. Subsequently an aluminum layer was sputtered and patterned, whereby an amorphous silicon TFT was completed.

What is claimed is:

1. An apparatus for producing a non-monocrystalline semiconductor device, including at least two film forming chambers adapted for forming non-monocrystalline semiconductor films on a substrate and being independent in vacuum conditions, comprising:
    means for transferring said substrate, said substrate having a length than either of said film forming chambers, subjected to formation of said non-monocrystalline semiconductor film in one of said film forming chambers to the other film forming chamber while maintaining said substrate in a plasma atmosphere, and wherein all the paths of transportation of the substrate are in a plasma atmosphere.

2. An apparatus according to claim 1, wherein each of said film forming chambers includes therein a high frequency electrode connected to a high frequency source and a shield member provided around said high frequency electrode;
    wherein the length of said high frequency electrode is approximately equal to the length of said substrate in the advancing direction thereof; and
    said apparatus further comprises a switch for connecting each of said shield members either to ground or to high frequency source.

3. An apparatus according to claim 2, further comprising:
    an induction-coupled plasma container in which said substrate is to be set; and
    a transfer tunnel provided between said film forming chambers and being independent vacuum condition.

* * * * *

UNITED STATES PATENT AND TRADEMARK OFFICE
CERTIFICATE OF CORRECTION

PATENT NO. : 5,324,360
DATED : June 28, 1994
INVENTOR(S) : HIRAKU KOZUKA

Page 1 of 2

It is certified that error appears in the above-identified patent and that said Letters Patent is hereby corrected as shown below:

Title page,
item [75] INVENTOR

"Kiraku Kozuka" should read --Hiraku Kozuka--.

COLUMN 1

Line 23, "this" should read --thin--.
    Line 31, "load-look" should read --load-lock--.

COLUMN 5

Line 41, "heater 18 1," should read --heater 181,--.

COLUMN 6

Line 14, "i-layer" should read --I-layer--.
    Line 17, "Source" should read --source--.

COLUMN 7

Line 12, "chamber:" should read --chamber;--.
    Line 14, "movable:" should read --movable;--.
    Line 32, "chamber." should read --chamber--.

COLUMN 8

Line 34, "State," should read --state,--.
    Line 45, "27 1," should read --271,--.

UNITED STATES PATENT AND TRADEMARK OFFICE
CERTIFICATE OF CORRECTION

PATENT NO. : 5,324,360
DATED : June 28, 1994
INVENTOR(S) : HIRAKU KOZUKA

Page 2 of 2

It is certified that error appears in the above-identified patent and that said Letters Patent is hereby corrected as shown below:

COLUMN 10

Line 24, "length" should read --length shorter--.
    Line 43, "to high" should read --to the high--.
    Line 44, "claim 2," should read --claim 1,--.

Signed and Sealed this

Thirteenth Day of December, 1994

Attest:

BRUCE LEHMAN

*Attesting Officer*    *Commissioner of Patents and Trademarks*